(12) United States Patent
Dabral et al.

(10) Patent No.: US 6,561,410 B2
(45) Date of Patent: May 13, 2003

(54) LOW COST AND HIGH SPEED 3 LOAD PRINTED WIRING BOARD BUS TOPOLOGY

(75) Inventors: Sanjay Dabral, Milpitas, CA (US); Ming Zeng, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/116,503

(22) Filed: Apr. 3, 2002

(65) Prior Publication Data

US 2002/0108240 A1 Aug. 15, 2002

Related U.S. Application Data

(62) Division of application No. 09/596,613, filed on Jun. 19, 2000.

(51) Int. Cl.[7] .......................... B23K 31/02; H05K 7/10; H05K 1/16
(52) U.S. Cl. ...................... 228/178; 228/175; 361/760; 361/777; 174/260; 174/261; 174/262
(58) Field of Search ................... 228/178, 175, 228/179.1, 180.1, 180.21, 180.22, 246; 257/3, 4, 786, 778; 361/638, 649, 760, 761, 780, 777; 29/830, 831, 840, 846, 849; 174/260–262

(56) References Cited

U.S. PATENT DOCUMENTS

| | | | | |
|---|---|---|---|---|
| 3,739,231 A | * | 6/1973 | Luteran | ........................ 361/805 |
| 5,095,407 A | * | 3/1992 | Kanezawa et al. | ........... 361/794 |
| 5,467,456 A | * | 11/1995 | Moxley et al. | ................. 716/15 |
| 5,502,621 A | | 3/1996 | Schumacher et al. | |
| 5,682,297 A | * | 10/1997 | Silva | .......................... 361/777 |
| 5,832,294 A | | 11/1998 | Reinschmidt | |
| 5,946,477 A | * | 8/1999 | Ito | ................................. 716/9 |
| 6,002,178 A | | 12/1999 | Lin | |
| 6,071,754 A | | 6/2000 | Wark | |
| 6,226,246 B1 | | 7/2001 | Crane et al. | |
| 6,285,086 B1 | * | 9/2001 | Sota et al. | ................... 257/786 |
| 6,310,398 B1 | * | 10/2001 | Katz | .......................... 257/773 |
| 6,417,462 B1 | * | 7/2002 | Dabral et al. | ................ 174/261 |
| 6,434,016 B2 | * | 8/2002 | Zeng et al. | .................. 361/760 |
| 6,479,758 B1 | * | 11/2002 | Arima et al. | ................ 174/260 |
| 6,483,714 B1 | * | 11/2002 | Kabumoto et al. | ......... 361/760 |

OTHER PUBLICATIONS

"Dynamic Termination Output Driver for a 600MHz Microprocessor", Sai Vishwanthaiah et al., ISSCC 2000/Session 15/High–Speed I/O/Paper TP 15.1, Digest of Technical Papers, Feb. 8, 2000 @ pp. 248–249.

U.S. patent application Ser. No. 09/001,550 of Dabral, et al.

* cited by examiner

*Primary Examiner*—Tom Dunn
*Assistant Examiner*—L. Edmondson
(74) *Attorney, Agent, or Firm*—Blakely, Sokoloff, Taylor & Zafman LLP

(57) ABSTRACT

A multi layer printed circuit board with a 3-load topology is disclosed. First, second, and third integrated circuit (IC) printed wiring board packages having first, second, and third sets of terminals respectively are mounted on opposite sides of the board so that the second set of terminals are directly opposite the third set of terminals. Each package contains an IC die coupled to the respective set of terminals. The IC die in the first package is substantially identical to the one contained in the second package, and different than the one contained in the third package. For improved fanout of the metal lines that interconnect the first package to the second and third packages, each of the first, second, and third sets of terminals in the packages is arranged in substantially a U-shape. Each set of terminals has the same set of signal assignments of a parallel bus implemented by metal lines in the board. The 3-load topology is particularly useful for personal computer motherboard units having twin processors and a bridge chip set, yielding a motherboard having significantly lower number of metal layers, a faster bus and significantly improved noise margin, all with high density IC packages on a wide parallel bus.

20 Claims, 5 Drawing Sheets

LOW COST AND HIGH SPEED 3 LOAD PRINTED WIRING BOARD BUS TOPOLOGY

This application is a divisional of Ser. No. 09/596,613 filed on Jun. 19, 2000.

FIELD OF THE INVENTION

This invention is related to integrated circuit (IC) packaging and multi-layer printed wiring boards for a bus architecture featuring several high density IC packages.

BACKGROUND

Multi-layer boards serve to implement the wiring in complex digital electronic systems and physically support the IC packages in the systems. In modem systems which have wide parallel buses (for instance those having 32 bits and higher address and/or data) and three (3) or more loads which share some of the address, data, and control lines of the bus, the board becomes a significant part of the total cost of the system. For instance, in a conventional 3-load system that features two processors and a bridge chip set with more than 400 pins per IC package, a 12 to 16 layer printed wiring board may be needed to implement the bus interconnect. In addition to an excessive number of layers, the conventional 3-load system also suffers from poor electrical performance, especially at bus speeds in excess of several hundred mega transactions per second (MT/s), because of long stubs (a section of interconnect branching away from the main bus) required to connect all the chips sharing a line of the main bus.

BRIEF DESCRIPTION OF THE DRAWINGS

The invention is illustrated by way of example and not by way of limitation in the figures of the accompanying drawings in which like references indicate similar elements. It should be noted that references to "an" embodiment in this disclosure are not necessarily to the same embodiment, and they mean at least one.

DETAILED DESCRIPTION

The various embodiments of the invention described below are directed to a 3-load topology suitable for modern electronic systems which have wide parallel buses and three or more loads which share the bus: The particular embodiments of the 3-load topology described here help reduce the total cost of the system by reducing the number of layers in the printed wiring board, also known as printed circuit board (PCB) that are needed to implement the bus interconnect. In addition, better electrical performance may be obtained, especially at bus speeds in excess of several hundreds of MT/s, due to better terminated stubs.

Figure 1:
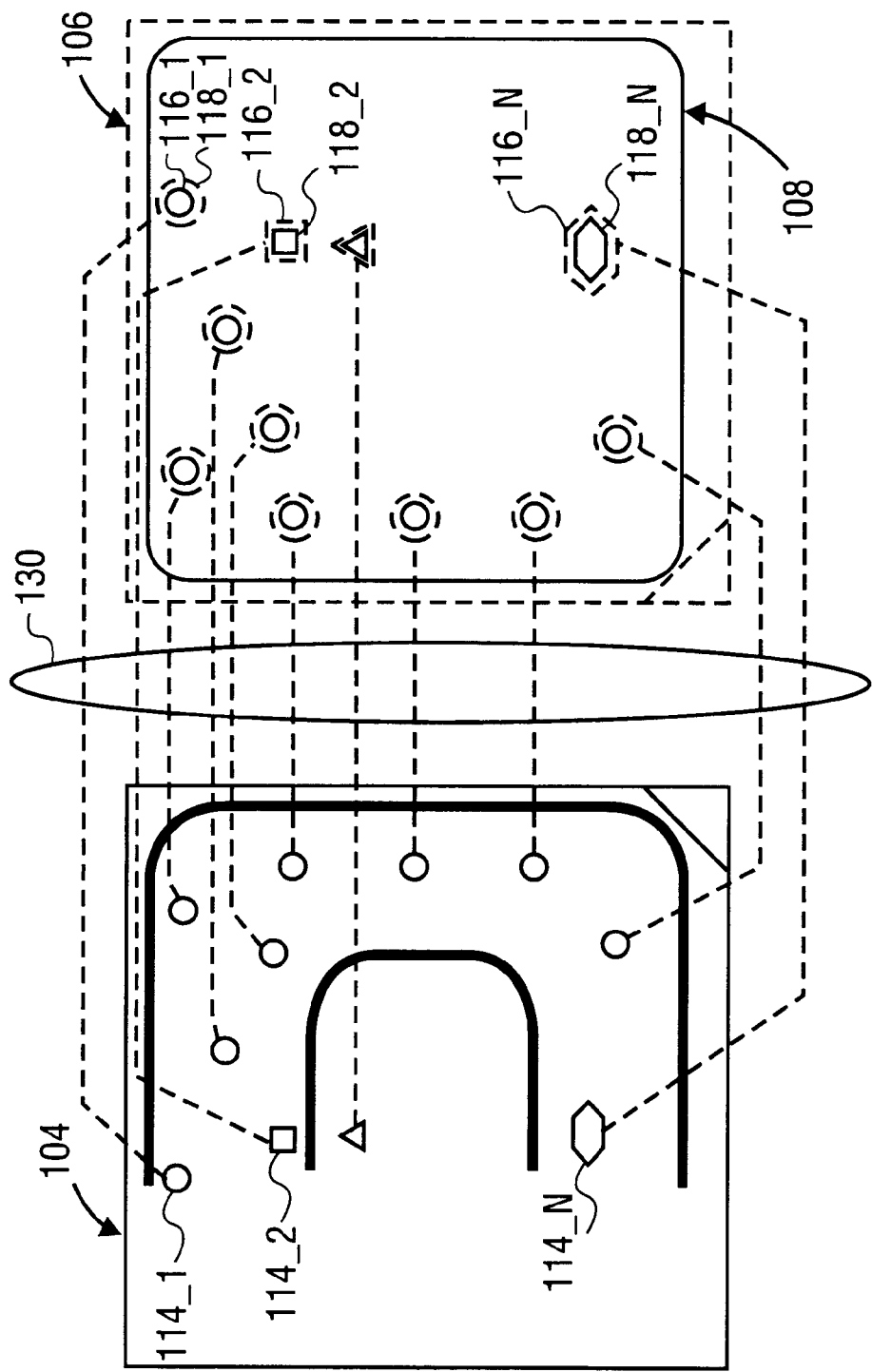
FIG. 1 depicts the layout of a 3-load system according to an embodiment of the invention.
Figure 2:
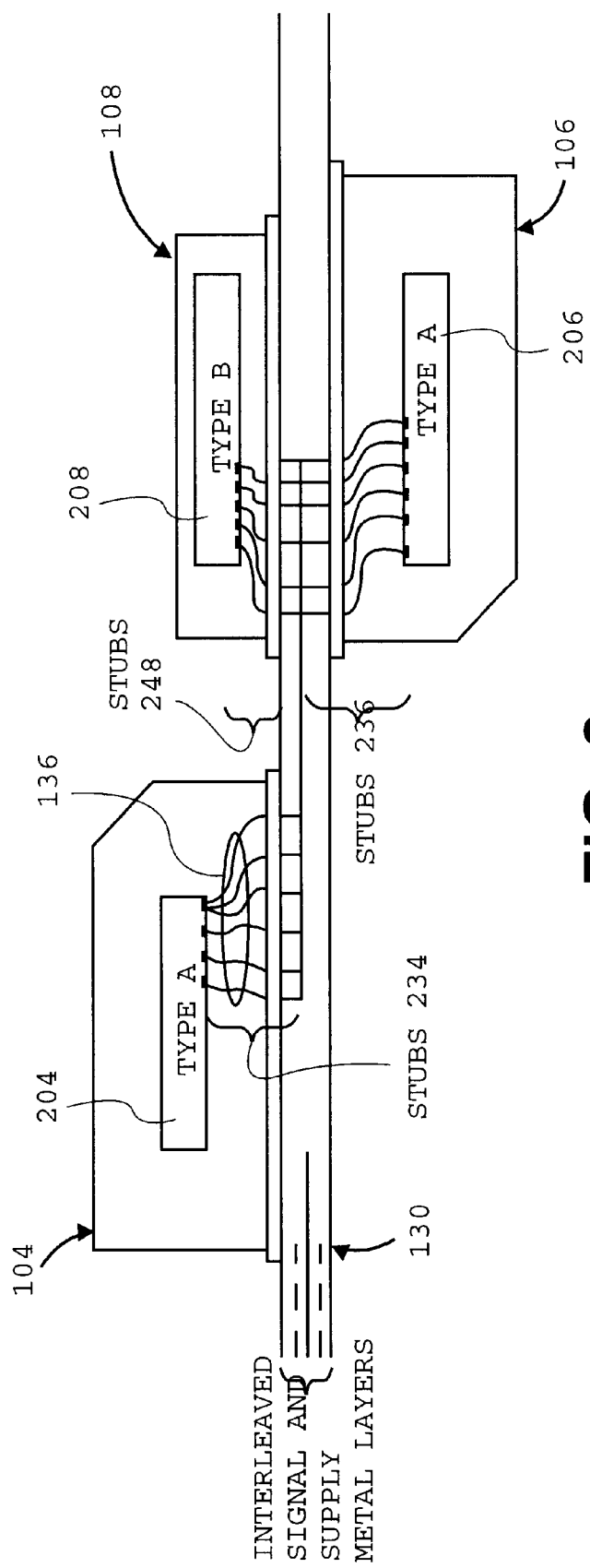
FIG. 2 shows a cross-sectional view of the 3-load topology.

FIG. 1 illustrates an embodiment of the 3-load topology. The three IC packages 104, 106, and 108 are mounted on a multi layer printed wiring board 130 by soldering or otherwise connecting respective sets of terminals 114, 116, and 118 to the board. Each package contains an IC die that's coupled to its respective set of terminals. FIG. 2 is a cross-sectional view of the 3-load topology, showing the respective dies 204, 206, and 208. Note that each package may contain additional dies that are not shown. The die 204 in the first package 104 may be substantially identical to the die 206 in the second package 106, and different than the die 208 contained in the third package 108. This is depicted in FIG. 2 by labeling dies 204 and 206 as type A, and labeling die 208 as type B. Alternatively, each of the three dies could be different from the others.

In a particular embodiment, the IC dies in the first package 104 and the second package 106 are essentially identical processor units, whereas the IC die in the third package 108 is a bridge chip set. Other types of dies having different logic functionalities may be used depending upon the application of the 3-load topology. Moreover, not only can the dies in the first package 104 and the second package 106 be essentially identical, the method for electrically connecting the pads on each die to the terminals of the package, labeled as mechanism 136 in FIG. 2, may also be identical so that the entire packages are essentially identical. This makes the 3-load topology particularly suitable for twin-processor personal computer motherboards. As seen in FIG. 2, the second package 106 is mounted directly opposite the third package 108 on opposite sides of the board, so that, as seen in FIG. 1, the second set of terminals 116_1, 116_2, . . . 116_N are directly opposite the third set of terminals 118_1, 118_2, . . . 118_N. Each of these sets of terminals has the same set of signal assignments of a parallel bus implemented by metal lines in the board. These signal assignments may include address, data, and/or control bits. Thus, the second set of terminals are arranged to mirror the third set of terminals.

Returning briefly to FIG. 1, it can be seen that each of the first, second, and third sets of terminals 114, 116, and 118 is arranged in substantially a U- shape. Such a configuration is particularly advantageous because it allows a "fanout" of the metal lines that short the respective terminals of the first set and the second/third sets, permitting a single metal layer in the printed circuit board 130 to be used to route a significant number of terminals. In this topology, wiring can "escape out" from three sides as shown, as opposed to the only one side possible in traditional topologies. This escape pattern reduces the number of signal layers by approximately 1/3. This is particularly advantageous when each of the first, second, and third sets of terminals number at least 32 terminals and the metal line width is no more than 3–8 thousandths of an inch.

As an additional improvement, the first package 104 may be mounted on the same side of the board 130 as the third package 108, seen in FIG. 2. Such a particular configuration allows for even greater fanout of the interconnections between the first package and the other two, such that an even greater number of terminals may be interconnected using a single metal layer. This particular configuration of the 3-load topology has been simulated for logic signaling using computer aided design software tools at 600 MT/s showing good noise margin and low ISI (Inter Symbol Interference) induced jitter. Thus, in addition to lower manufacturing costs due to a reduced number of metal layers in the circuit board 130, the 3-load topology also enables faster bus speeds of greater than 500 MT/s as well as significantly improved noise margin because of better signal integrity.

The multi-layer printed wiring board 130 described above may be made with the respective sets of solder regions formed on opposite sides of the board 130 using conventional circuit board manufacturing techniques. The solder regions may be soldered to the terminals of a respective IC package using a variety of different techniques. Such techniques include mass reflow and manual and hot bar soldering of the package to the circuit board. The printed wiring board has a stripline architecture in which a metal signal line may be sandwiched between two metal supply layers as shown in FIG. 2. Alternatively, two layers of signal lines may be sandwiched by the same pair of supply layers. Both of the supply layers may be electronically connected to the same source potential (e.g. Vss or ground), or different potentials, depending on the type of signaling. The manufacturing of the board and the assembling of the system including soldering the packages or sockets onto the board may be performed by different entities.

Figure 3:
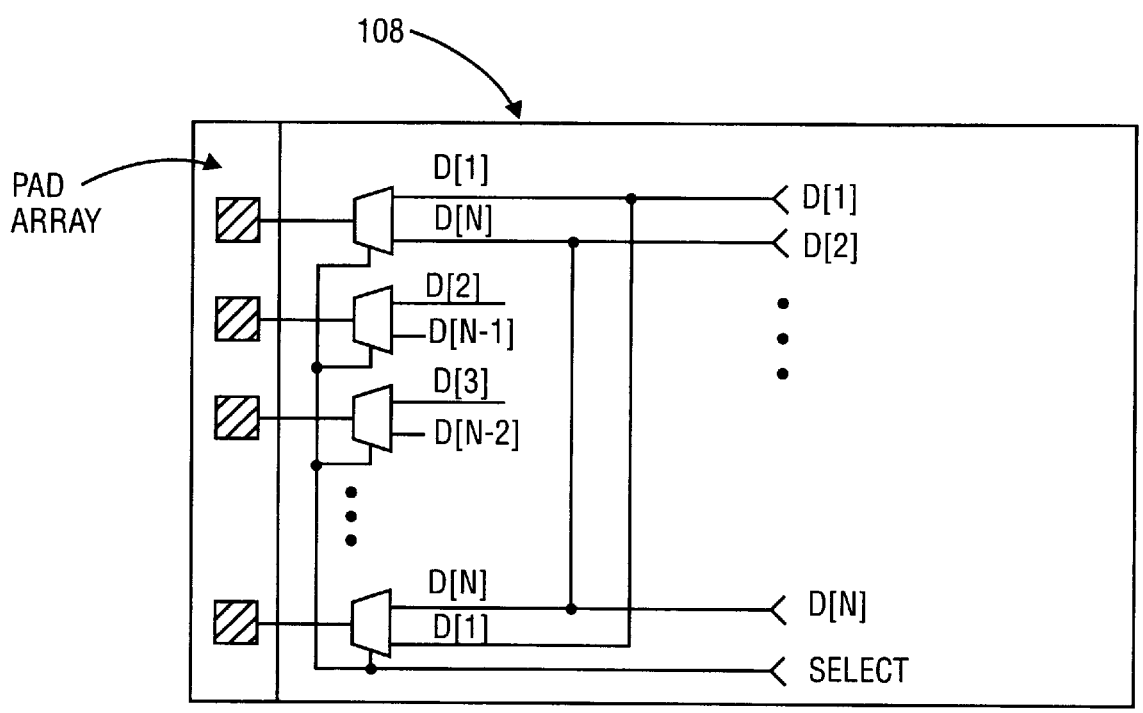
FIG. 3 shows the on-chip circuitry used for changing signal assignments in the third IC package according to another embodiment of the 3-load topology.

FIG. 3 shows yet another alternative for the third package 108, where this time the die in the package further includes a number of pairs of multiplexers, where each of the third set of terminals, and therefore each pad shown in the pad array, is coupled to an output of a respective multiplexer. Each multiplexer in a pair receives the same pair of input signals, and thereby allows a change or reversal in the signal assignments of the pads/terminals by simply selecting which assignment is desired.

Figure 4:
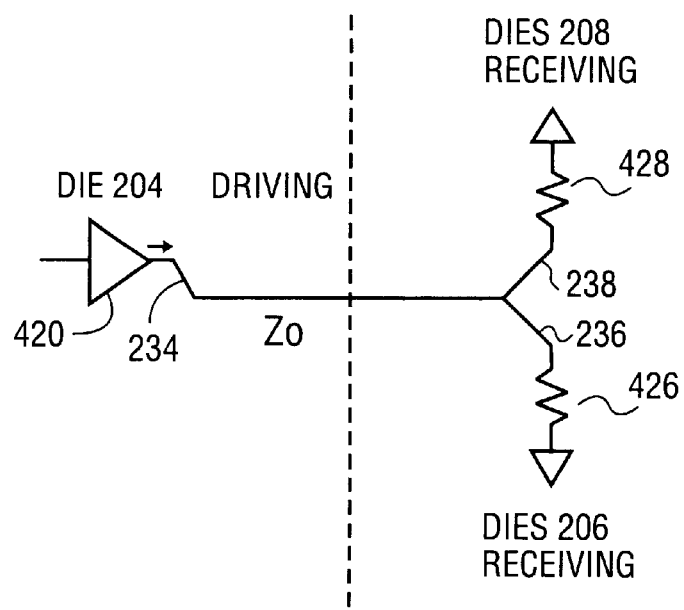
FIG. 4 illustrates an equivalent circuit schematic of a first die driving another essentially identical die and a third die, in an embodiment of the 3-load topology.
Figure 5:
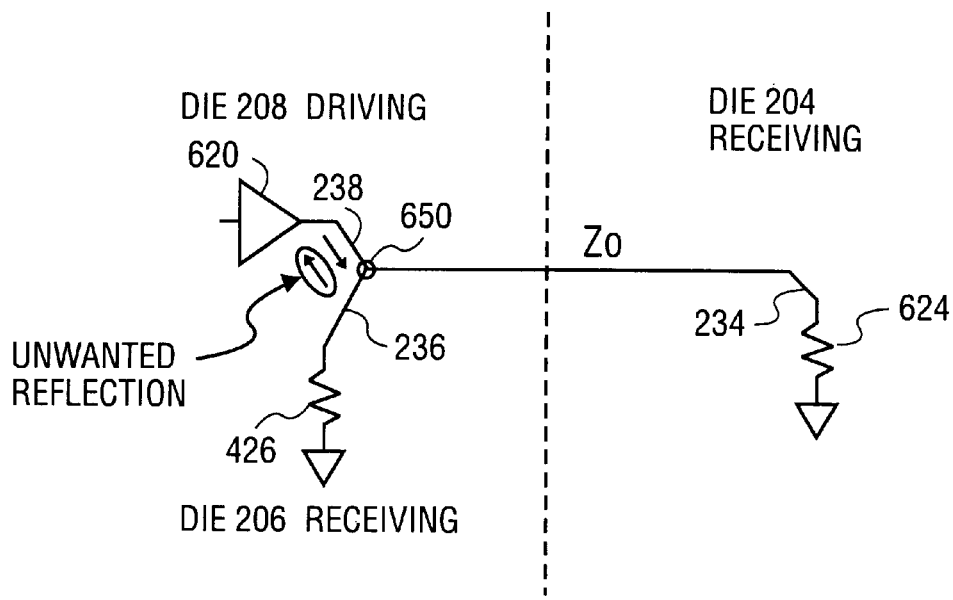
FIG. 5 shows the equivalent circuit schematic of a die in either of the packages which are directly opposite each other, driving a signal onto the bus.

FIGS. 4 and 5 illustrate the equivalent circuit schematics of an I/O circuit driving the bus in the 3-load topology. FIG. 4 shows an I/O circuit 420 in die 204 driving the bus. The output of the I/O circuit 420 is connected to a piece of transmission line having characteristic impedance $Z_0$ through a stub. The stub 234 represents the entire electrical path between a pad on the die 204 and a point in the printed wiring board 130 which may be deemed to be part of the bus that connects the die 204 to dies 208 and 206. Similarly, there are stubs 238 and 236 that attach pads in the die 208 and the die 206 to the transmission line. Connected to each stub 238, 236, are termination resistors 428 and 426 that automatically "appear" when the line is not being driven. These termination devices may provide a path to a power supply rail at Vcc or ground, or they may be center tapped terminations to Vcc/2. The value of the resistance provided by these termination devices may be in the range $Z_0-2*Z_0$ where $Z_0$ is the characteristic impedance of a relatively long section of metal line that connects the solder pads on the board 130 for the first package 104 to those used for the second or third packages 106, 108 (see FIG. 1). This metal line may be viewed as being a part of the parallel bus of the 3-load topology.

FIG. 5 shows an equivalent circuit schematic of the 3-load topology when the die 208 is driving a signal on the bus. The equivalent circuit for the case when die 206 is driving the bus is essentially identical to that shown in FIG. 5, because the stubs 238 and 236 are essentially of the same length and shape. At the other end of the metal line, the I/O circuit 420 in the die 204 will be in the receiving mode, such that the stub 234 is automatically terminated by the device 624 having an impedance value equal to $Z_0$.

Figure 6:
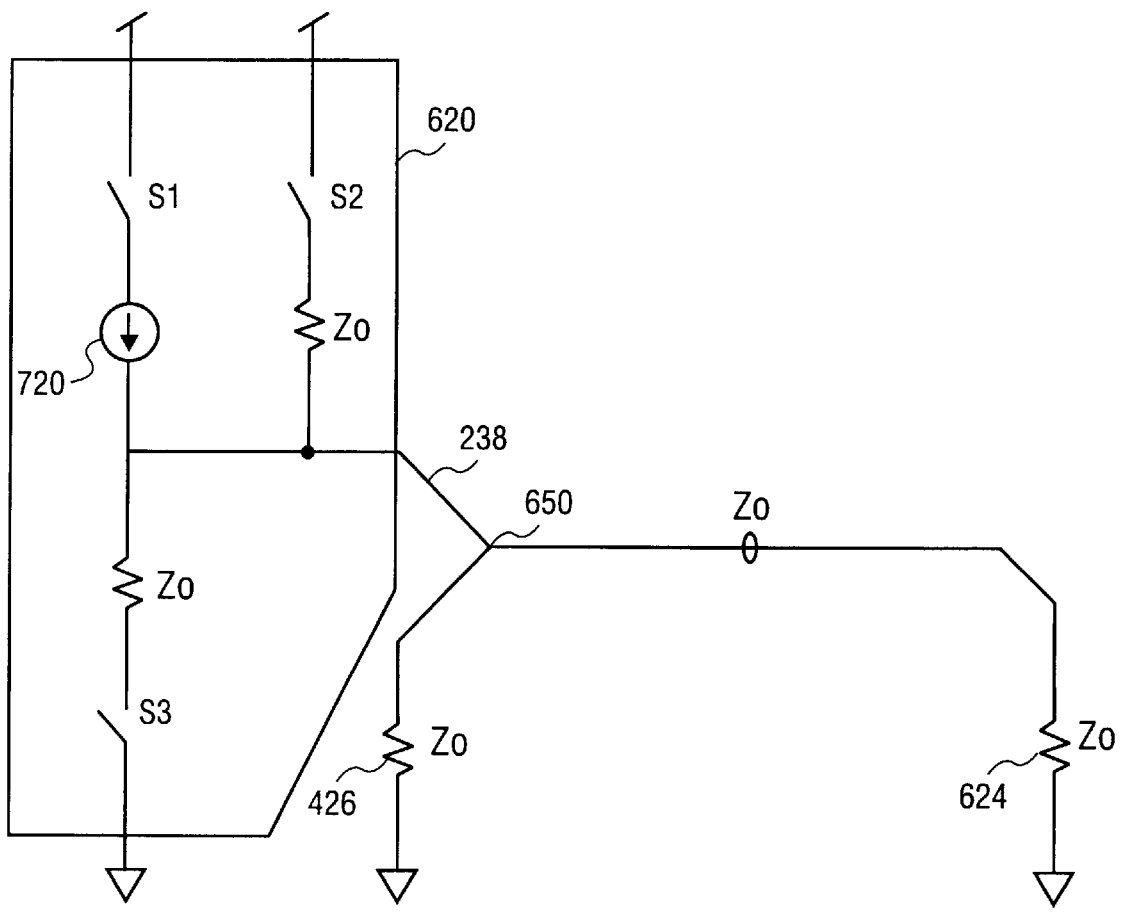
FIG. 6 shows a circuit schematic of an I/O circuit suitable for reducing unwanted reflections in the 3-load topology.

Returning to the driving end of the line at die 208, a different I/O circuit 620 is used than the one in die 204 (see FIG. 4), to suppress the unwanted reflection shown as originating from a discontinuity 650. Note that such an unwanted reflection is not likely to occur when die 204 is driving as seen in FIG. 4, because the relatively long piece of transmission line between die 204 and the pair of dies 206/208 presents an impedance that may be very close to $Z_0$. To help reduce and perhaps eliminate the unwanted negative reflection in FIG. 5, the I/O circuit 620 shown in FIG. 6 may be used in which a current mode driver together with a pull-up having an effective output impedance $Z_0$ drives the input signal when switches S1 and S2 are closed and S3 is open. As an alternative, a pull-down can be used by closing S3. The desired signal swing can be set by adjusting the current output of the source 720 and the pull-up/pull-down resistance valve. When receiving, switches S1 and S2 are open and S3 is closed, thereby terminating the stub 238 in $Z_0$. In this way, the unwanted reflection shown in FIG. 5 is essentially absorbed by the I/O circuit while driving and the stub is properly terminated while receiving, thus helping improve signal integrity. In general, the equivalent circuit schematics of FIGS. 4 and 5 illustrate a trade off between signal integrity, power consumption, and size of the I/O circuitry. These factors should be evaluated carefully when selecting the impedance value of the termination devices. The size of the I/O circuitry, for example, becomes an issue, particularly when considering that high density IC packages may have several hundred I/O circuits that need to be implemented on-chip. It should be noted that the termination devices must be implemented on-chip, to help reduce the effect of the stub on transmission line impedance mismatching.

To summarize, various embodiments of a low cost and high speed 3-load bus topology have been described that may be implemented using relatively few metal layers in the circuit board. The embodiments may allow relatively high transaction rates at acceptable noise margin levels. In the foregoing specification, the invention has been described with reference to specific exemplary embodiments. It will, however, be evident that various modifications and changes may be made thereto without departing from the broader spirit and scope of the invention as set forth in the appended claims. For instance, the IC packages as referenced above may be of various different types, including surface mount ball grid array or a socketed pin grid array. Also, the electrical connections between the pads on the die and the terminals in the package may be implemented using wire bonding techniques or flip chip technology (also known as C-4 connections). The detailed description and the drawings are, accordingly, to be regarded in an illustrative rather than a restrictive sense.

What is claimed is:

1. A method comprising:
   making a multi-layer printed circuit board having a plurality of metal lines in a single layer; and
   making first, second, and, third sets of solder regions on opposite surfaces of the board, each set of solder regions to be soldered to a plurality of terminals of a respective integrated circuit (IC) package, each solder region in a respective set to be soldered to a respective terminal of the respective IC package, each of the metal lines shorts a respective solder region of the first set to solder regions of the second and third sets, the second and third sets are disposed on opposite sides of the board so that each solder region of the second set is directly opposite a respective solder region of the third set, and each of the first, second, and third sets is arranged in substantially a U-shape.

2. The method of claim 1 wherein the printed circuit board is made with each of the first, second, and third sets of solder regions numbering at least 32 and no more than 6 layers.

3. The method of claim 1 wherein the printed circuit board is made with the first set of solder regions located on the same side of the board as the third set of solder regions.

4. The method of claim 2 further comprising:
soldering first, second, and third sets of terminals of first, second, and third IC packages, respectively, to the first, second, and third sets of solder regions, respectively, each of the first, second, and third sets of terminals has the same set of signal assignments of a bus implemented by the metal lines in the board.

5. The method of claim 4 wherein each IC package contains an IC die coupled to the respective set of terminals as a load on the bus, the IC die in the first package is substantially identical to the one in the second package and different than the one in the third package.

6. The method of claim 5 wherein in the third package, the die further comprises a plurality of pairs of multiplexers, each of the third set of terminals is coupled to an output of a respective multiplexer, each multiplexer in a pair to receive the same pair of input signals.

7. A method for assembling an electronic system, comprising:
procuring a multi-layer printed circuit board having first, second, and third sets of solder regions, the board has a plurality of metal lines in a single layer, each of the metal lines shorts a respective solder region of the first set to solder regions of the second and third sets, the second and third sets are disposed on opposite sides of the board so that each solder region of the second set is directly opposite a respective solder region of the third set, and each of the first, second, and third sets is arranged in substantially a U-shape; and
soldering first, second, and third sets of terminals of first, second, and third IC packages, respectively, to the first, second, and third sets of solder regions on the multi-layer-printed circuit board, each terminal in a respective set being soldered to a respective solder region of the respective set of solder regions.

8. The method of claim 7 wherein each of the first, second, and third sets of terminals number at least 32 terminals and the board has no more than 6 layers.

9. The method of claim 7 wherein each of the first, second, and third sets of terminals has the same set of signal assignments of a parallel bus implemented by the metal lines in the board.

10. The method of claim 9 wherein each IC package contains an IC die coupled to the respective set of terminals as a load on the bus, the IC die in the first package is substantially identical to the one in the second package and different than the one in the third package.

11. The method of claim 10 wherein the first and second packages contain substantially identical processors and the third package contains a bridge chipset.

12. The method of claim 7 wherein the first set of solder regions are located on the same side of the board as the third set of solder regions.

13. An article of manufacture comprising:
a multi-layer printed circuit board having a plurality of metal lines in a single layer; and
first, second, and third sets-of solder regions formed on opposite surfaces of the board, each set of solder regions being designed to be soldered to a plurality of terminals of a respective integrated circuit (IC) package, each solder region in a respective set to be soldered to a respective terminal of the respective IC package, each of the metal lines shorts a respective solder region of the first set to solder regions of the second and third sets, the second and third sets are disposed on opposite sides of the board so that each solder region of the second set is directly opposite a respective solder region of the third set, and one of the first, second, and third sets is arranged in substantially a U-shape.

14. The article of manufacture of claim 13 wherein each of the first, second, and third sets of solder regions number at least 32 and there are no more than 6 layers in the board.

15. The article of manufacture of claim 13 wherein the first set of solder regions are located on the same side of the board as the third set of solder regions.

16. The article of manufacture of claim 15 further comprising first, second, and third IC packages whose first, second, and third sets of terminals are soldered to the first, second, and third sets of solder regions, respectively, and wherein one of said IC packages is a socketed pin grid array type.

17. The article of manufacture of claim 15 wherein each IC package contains an IC die coupled to the respective set of terminals as a load on the bus, the IC die in the first package is substantially identical to the one in the second package and different than the one in the third package.

18. The article of manufacture of claim 15 further comprising: first, second, and third IC packages whose first, second, and third sets of terminals are soldered to the first, second, and third sets of solder regions, respectively, each of the first, second, and third sets of terminals has the same set of signal assignments of a bus implemented by the metal lines in the board.

19. The article of manufacture of claim 18 wherein each IC package contains an IC die coupled to the respective set of terminals as a load on the bus, the IC die in the first package is substantially identical to the one in the second package and different than the one in the third package.

20. The article of manufacture of claim 19 wherein in the third package, the die further comprises a plurality of pairs of multiplexers, each of the third set of terminals is coupled to an output of a respective multiplexer, each multiplexer in a pair to receive the same pair of input signals.

* * * * *

UNITED STATES PATENT AND TRADEMARK OFFICE
CERTIFICATE OF CORRECTION

PATENT NO. : 6,561,410 B2
DATED : May 13, 2003
INVENTOR(S) : Dabral et al.

It is certified that error appears in the above-identified patent and that said Letters Patent is hereby corrected as shown below:

Column 1,
Line 16, delete "modem", insert -- modern --.

Signed and Sealed this

Thirtieth Day of September, 2003

JAMES E. ROGAN
*Director of the United States Patent and Trademark Office*